United States Patent
Butzer et al.

(10) Patent No.: US 9,733,682 B2
(45) Date of Patent: Aug. 15, 2017

(54) SCALABLE COMPUTING RACK POWER DISTRIBUTION UNIT

(71) Applicant: VCE Company, LLC, Richardson, TX (US)

(72) Inventors: Daniel Joseph Butzer, McKinney, TX (US); Mark Steven Tuck, Allen, TX (US)

(73) Assignee: VCE IP Holding Company LLC, Richardson, TX (US)

( * ) Notice: Subject to any disclaimer, the term of this patent is extended or adjusted under 35 U.S.C. 154(b) by 434 days.

(21) Appl. No.: 14/135,095

(22) Filed: Dec. 19, 2013

(65) Prior Publication Data

US 2015/0177797 A1 Jun. 25, 2015

(51) Int. Cl.
- *G06F 1/00* (2006.01)
- *G06F 1/26* (2006.01)
- *G06F 1/18* (2006.01)
- *H05K 7/14* (2006.01)

(52) U.S. Cl.
CPC ............ *G06F 1/26* (2013.01); *G06F 1/189* (2013.01); *H05K 7/1492* (2013.01)

(58) Field of Classification Search
CPC .......... G06F 1/3203; G06F 1/26; G06F 1/189; H05K 7/1492
USPC ............. 439/95, 652, 536; 307/38, 151, 25; 713/300; 70/344
See application file for complete search history.

(56) References Cited

U.S. PATENT DOCUMENTS

| | | | | |
|---|---|---|---|---|
| 7,196,900 B2* | 3/2007 | Ewing | ............ | H02B 1/306 174/59 |
| 8,033,867 B1* | 10/2011 | Kessler | ............ | H01R 25/003 439/652 |
| 8,093,748 B2* | 1/2012 | Martins | ............ | H01R 27/00 307/127 |
| 9,218,033 B1* | 12/2015 | Roy | ............ | H02J 4/00 |
| 9,374,926 B1* | 6/2016 | Fontana | ............ | H05K 7/1492 |
| 2006/0133079 A1* | 6/2006 | Callahan | ............ | E04C 3/08 362/242 |
| 2007/0025090 A1* | 2/2007 | Belady | ............ | H05K 7/1492 361/724 |
| 2007/0046103 A1* | 3/2007 | Belady | ............ | H02G 3/00 307/12 |
| 2007/0217128 A1* | 9/2007 | Johnson, Jr. | ............ | H05K 7/1492 361/622 |
| 2008/0211321 A1* | 9/2008 | Liao | ............ | H01R 31/06 307/151 |
| 2010/0264733 A1* | 10/2010 | Arimilli | ............ | H05K 7/1492 307/31 |

(Continued)

FOREIGN PATENT DOCUMENTS

WO  WO 2012166900 A2 * 12/2012 ............ G06F 1/189

*Primary Examiner* — Aurel Prifti
(74) *Attorney, Agent, or Firm* — Polsinelli PC

(57) ABSTRACT

A power distribution unit (PDU) with at least one power distribution module configured in a computing rack and an interchangeable adapter coupled to the power distribution module to provide power to the distribution module. The power distribution module includes multiple power receptacles for coupling to a plurality of devices disposed in the computing rack. The interchangeable adapter is electrically connectable to one of a plurality of different electrical power sources in which each electrical power source has a phase type configuration that differs from one another.

19 Claims, 7 Drawing Sheets

(56) References Cited

U.S. PATENT DOCUMENTS

| | | | | |
|---|---|---|---|---|
| 2011/0080693 A1* | 4/2011 | Tsai | ............ | G06F 1/189 |
| | | | | 361/634 |
| 2011/0136353 A1* | 6/2011 | Spitaels | ............ | H01R 25/003 |
| | | | | 439/95 |
| 2011/0302440 A1* | 12/2011 | DiMarco | ............ | G06F 1/26 |
| | | | | 713/340 |
| 2013/0196535 A1* | 8/2013 | Utz | ............ | H01R 23/6866 |
| | | | | 439/536 |
| 2013/0198534 A1* | 8/2013 | Bailey | ............ | G06F 1/30 |
| | | | | 713/300 |
| 2013/0241287 A1* | 9/2013 | Hui | ............ | H02J 13/0006 |
| | | | | 307/38 |
| 2013/0249286 A1* | 9/2013 | Hou | ............ | G06F 1/26 |
| | | | | 307/18 |
| 2015/0135783 A1* | 5/2015 | Jiang | ............ | H05K 7/1492 |
| | | | | 70/344 |
| 2015/0326134 A1* | 11/2015 | Jouper | ............ | H02M 5/04 |
| | | | | 307/9.1 |

* cited by examiner

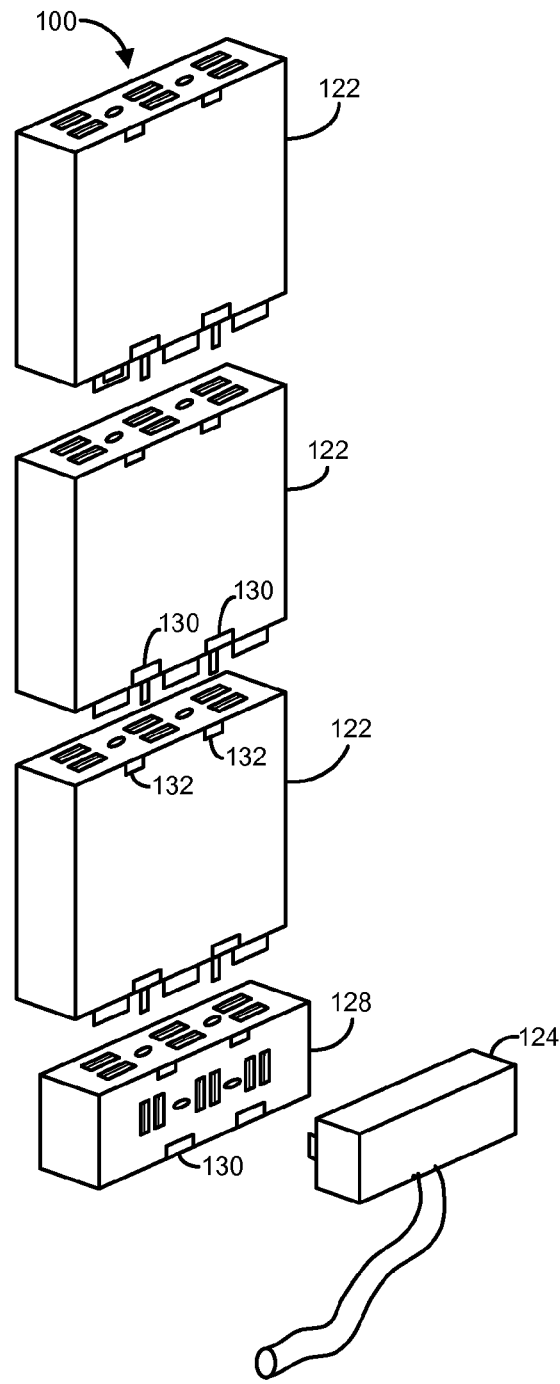
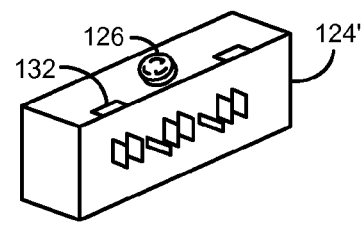
FIG. 1B
FIG. 2

SCALABLE COMPUTING RACK POWER DISTRIBUTION UNIT

TECHNICAL FIELD

Aspects of the present disclosure relate to computing systems and, in particular, to a scalable input and output rack power distribution unit and method of using the same.

BACKGROUND

Many large scale computing systems are commonly implemented using distributed computing technologies, such as computer clusters, computer arrays, and converged infrastructures using multiple computing equipment devices that function in a synergistic manner to support the overall processing load of the computing system. Computing systems such as these are often configured in computing racks that generally provide a standardized physical structure for housing and protecting the computing equipment devices used by the computing system. Computing equipment devices configured for placement within racks are generally referred to as rack-mount systems, rack-mounted chasses, rack-mounted instruments, and the like. These racks typically include two side walls that are configured with rails onto which the computing equipment devices may be mounted, and doors on either the front and/or back side of the rack for enclosing the computing equipment devices thus forming a plenum for the movement of air through the rack for cooling the computing equipment devices.

Rack design has evolved over time to provide several benefits for the operation of the computing systems that they house. Nevertheless, the relatively dense packaging of computing equipment devices provided by modern rack designs has presented challenges for their use. For example, most large scale computing systems are designed to be extensible or expandable so that additional computing equipment devices may be added as the needs of their users grow over time. Currently implemented rack designs, however, are often not well suited for the addition of computing equipment devices after the computing system has been placed in service. Additionally, unique power distribution units (PDUs) are often required for each type of power source to support the relatively large variations in product configurations across the world in which variations in the type of power sources may vary greatly.

SUMMARY

According to one aspect, a power distribution unit (PDU) at least one power distribution module configured in a computing rack and an interchangeable adapter coupled to the power distribution module to provide power to the distribution module. The power distribution module includes multiple power receptacles for coupling to a plurality of devices disposed in the computing rack. The interchangeable adapter electrically connectable to one of a plurality of different electrical power sources in which each electrical power source has a phase type configuration that differs from one another.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters refer to the same parts throughout the different views. The drawings depict only typical embodiments of the present disclosure and, therefore, are not to be considered limiting in scope.

FIGS. 1A and 1B illustrate an example scalable (PDU) implemented in a computing rack according to one embodiment.

FIG. 2 illustrates another example adapter that is oriented upside down relative to the adapter shown in FIGS. 1A and 1B to reveal a chassis mounted receptacle for electrical coupling to a suitable power source and a latch receptacle for releasable securement to the adapter interconnector according to one embodiment.

DETAILED DESCRIPTION

Aspects of a scalable power distribution unit (PDU) described herein provides an extensible and adaptable solution for computing systems, such as computer clusters, converged infrastructures, computer grids, and the like configured in computing racks. Conventional PDUs provide a mechanism for distributing electrical power to devices housed in computing racks. Nevertheless, these conventional PDUs are extensible in that they are difficult to remove and/or replace once the computing racks are populated with devices. This problem may be exacerbated in conditions in which computing racks that are configured for connection to a certain type of power source is shipped to another location where that same type of power source is not available. The scalable PDU according to the teachings of the present disclosure has a modular design that allows initial implementation of only one or a small number of power distribution modules, and later on in time as new computing equipment devices are added, additional power distribution modules may be added to support the power requirements of these new devices. Each power distribution module includes a relatively large quantity and variation of power receptacles to support most computing equipment device configurations that may be provided in the computing rack.

Additionally, the scalable PDU provides an input power adapter that adapts its electrical configuration according to a type of power source 118 available to the rack. In some cases, the adapter may eliminate the need for unique and specific PDUs for each input voltage, input phase, input current and input phase configuration (e.g., single phase configuration, three phase wye configuration, and three phase delta configuration). Additionally, because the adapters are relatively small in size, adapters for each foreseeable power configuration may be provided with each computing system across the world to provide a relatively high likelihood that one adapter may be implemented to adapt the available source of power to the needs of the computing system configured in the computing rack.

The scalable PDU may also accommodate a scenario in which a computing system is commissioned in a first location with a first power source configuration and then is moved to a second location having a differing power configuration. In this case, the scalable PDU is easily configured for use at the new location by simply replacing the existing adapter with a new adapter configured to work with the new power source configuration.

Figure 1A:
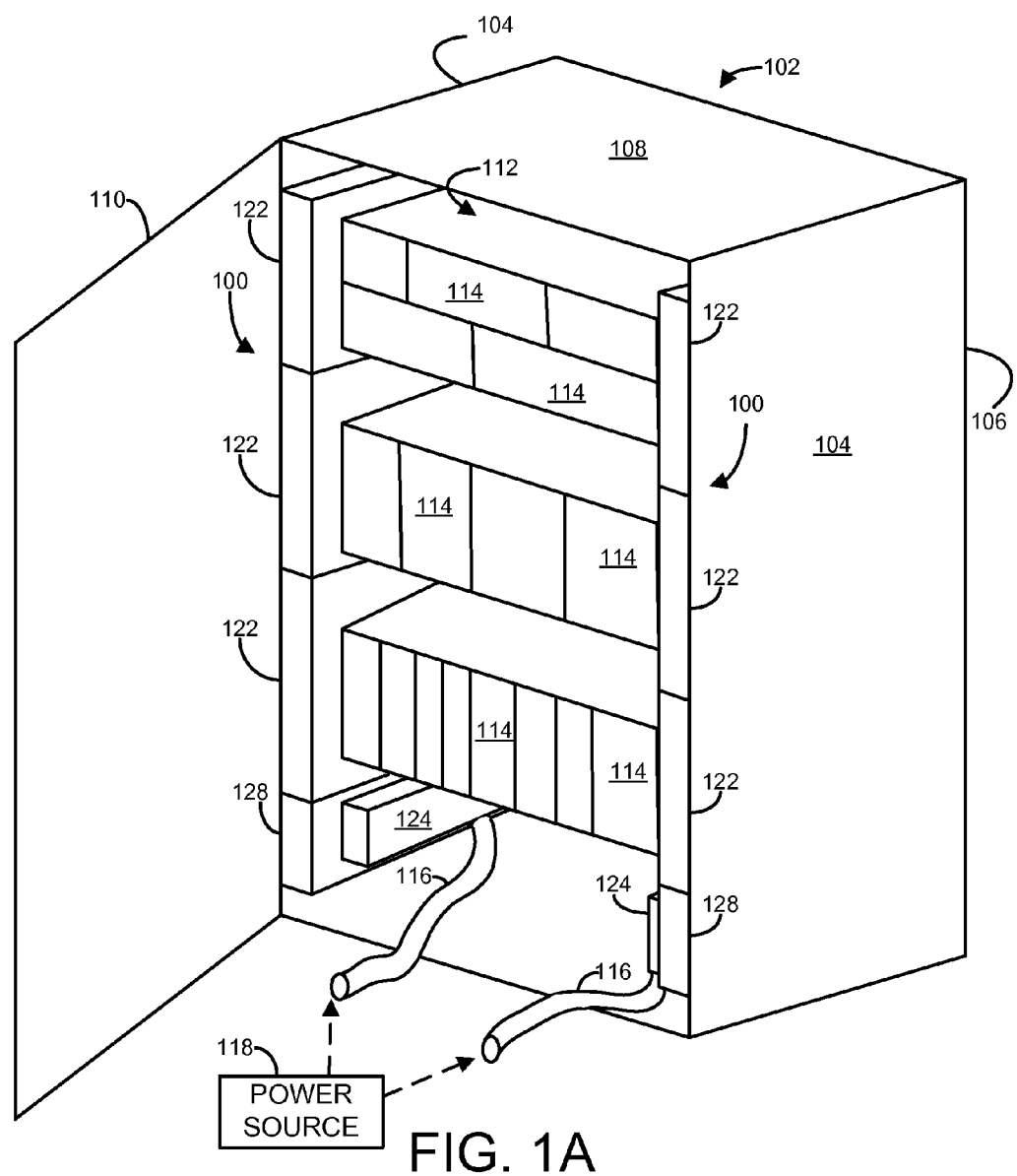

FIGS. 1A and 1B illustrate an example of a pair of scalable PDUs 100 implemented in a computing rack 102 according to the teachings of the present disclosure. The computing rack 102 generally includes two sidewalls 104, a back wall 106, a top surface 108, and a door 110 that define an enclosure 112. The enclosure 112 is adapted for placement of multiple computing equipment devices 114, which may be for example, rack-mounted computing devices of a converged infrastructure. The scalable PDUs 100 provide electrical power to the computing devices 114 from a corresponding one or more power cables 116. The scalable PDUs 100 use a modular design that provides efficient extensibility to power additional computing equipment devices that may be added within the rack, and is easily adapted to any suitable type of power source 118.

In the particular example shown, the computing rack 102 includes two scalable PDUs 100 for providing electrical power to the computing equipment devices 114. Nevertheless, it should be understood that the computing rack 102 may include other numbers of scalable PDUs 100, such as one scalable PDU 100, or three or more scalable PDUs 100. The computing rack 102 includes scalable PDUs 100 as shown in FIG. 1 for various reasons, such as for power redundancy or for enhanced physical access to electrical power by the computing equipment devices 114 of the computing system. For example, one scalable PDU 100 may provide redundant operation to the other scalable PDU 100 such that, in the event that one scalable PDU 100 should be taken off line for any reason, the other scalable PDU 100 may continually provide power to the computing equipment devices 114 for continued operation of the computing system. As another example, one of the scalable PDUs 100 may be coupled to a first source of electrical power, while the other scalable PDU 100 is coupled to a second source of electrical power such that one of the PDU's may provide power in the event power is lost from one of the power sources and not the other.

The two scalable PDUs 100 are also shown configured proximate each sidewall 104. Nevertheless, it should be understood that the scalable PDUs 100 may be configured in any suitable manner within the rack's enclosure 112. Configuring the scalable PDUs 100 on opposing sides of the enclosure 112 provides ease of access to the computing equipment devices 114, while not hindering the routing of other cabling between the computing equipment devices 114. For example, placement of the scalable PDUs 100 proximate the sidewalls 104 of the computing rack 102 provides for relatively efficient insertion and extraction of individual computing equipment devices 114 from the front or back of the computing rack 102 without undue hindrance from the scalable PDUs 100.

According to aspects of the present disclosure, each scalable PDU 100 includes multiple power distribution modules 122 that may be added to or removed from its respective scalable PDU 100 on an as needed basis for distributing electrical power through the computing rack 102. That is, one or more power distribution modules 122 may be selectively added after the PDU 100 is placed in service, thus forming a scalable power distribution system that may grow as the power needs of the computing rack in which the PDU 100 placed grows. For example, a scalable PDU 100 may be configured with one, two, or three or more power distribution modules 122 according to the electrical power needs of the system. For example, a computing system having relatively few computing equipment devices 114 and other peripheral components may be implemented using a scalable PDU 100 having only one power distribution module 122, and as the needs of the computing system grows, one or more additional power distribution modules 122 may be added to supply electrical power to additional computing equipment devices 114 and other peripheral components installed in the computing rack 102.

In one embodiment, each scalable PDU 100 is configured to be implemented with one, two, or three power distribution modules 122. The power distribution modules 122 are dimensioned such that, when the scalable PDU 100 is fully populated with three power distribution modules 122, the scalable PDU 100 fits comfortably within a standard sized rack having an overall height of 66.0 inches, an overall depth of 22.0 inches, and an overall width of 3.0 inches. Given these constraints, each of these power distribution modules 122 has a height of approximately 20.0 inches, a width of 3.0 inches, and a depth of 22.0 inches. Nevertheless, it should be understood that the power distribution modules may have different dimensions, including a different height (e.g., greater than 20.0 inches, or less than 20.0 inches), a different depth (e.g., greater than 22.0 inches, or less than 22.0 inches), and/or a different width (e.g., greater than 3.0 inches, or less than 3.0 inches).

According to another aspect of the present disclosure, each scalable PDU 100 also includes an adapter 124 for electrically coupling the power distribution modules 122 to a suitable power source 118 and an adapter interconnector 128 coupled between the adapter 124 and power distribution modules 122. Elements of the adapter 124 and adapter interconnector 128 will be discussed in detail herein below. In other embodiments, the adapter 124 and adapter interconnector 128 may be integrally formed in one unit that is directly coupled to the power distribution modules 122.

The adapter 124 distributes power to each module 122 forming the PDU 100. In one embodiment, the adapter 124 is hardwired with cabling 116 that is extended to the source of power. In another embodiment, the adapter 124' (FIG. 2) includes a connector 126 configured on its housing that is configured to be mated with a complementary connector that is coupled to the power source 118. In the particular embodiment shown, the adapter interconnector 128 has a width and depth generally similar to that of the power distribution modules 122 and is coupled to one power distribution module 122 at its bottom surface while the adapter 124 is configured to be coupled to the adapter interconnector 128 on its side surface. Nevertheless, the adapter 124 and adapter interconnector 128 may have any size, shape, or arrangement relative to one another for interconnection with the power distribution modules 122 without departing from the spirit and scope of the disclosure.

Latching mechanisms are included on each module 122 for providing a releasable mounting structure to another adjacent module 122 and the adapter interconnector 128 for releasable securement thereto. Each latching mechanism includes a latch bolt 130 on the module 122 that releasably engages a complementary latch receptacle 132 configured on either another module 122 or on the adapter interconnector 128. The adapter interconnector 128 may also include a latch bolt 130 that releasably secures the adapter 124 adjacent to the adapter interconnector 128. Although the present embodiment teaches the use of a latching mechanism for releasable securement of the adapters 122, adapter interconnector 128, and adapter 124 to one another, it should be understood that other types of releasable securement mechanisms may be used, such as screws, bolts, or other types of releasable securement mechanisms.

Figure 3A:
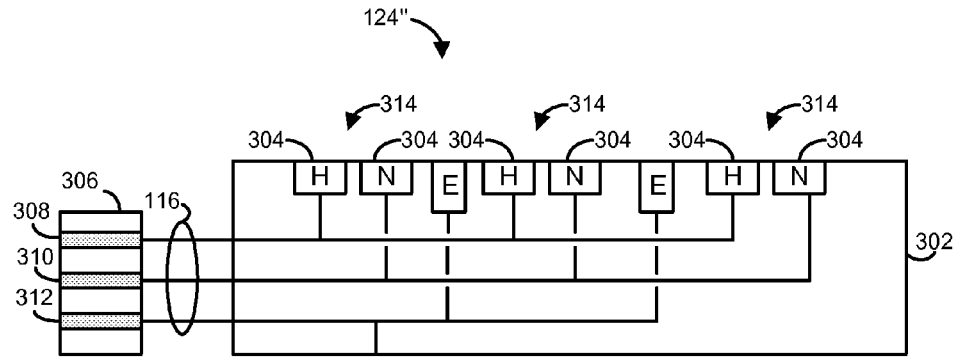
FIGS. 3A through 3C are wiring diagrams of example adapters showing how the scalable PDU may be adapted for using various types of electrical power according to one embodiment.
Figure 3B:
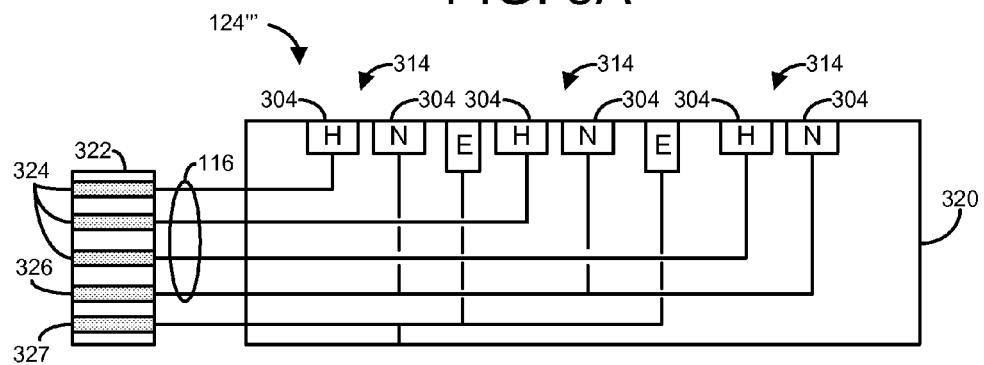
Figure 3C:
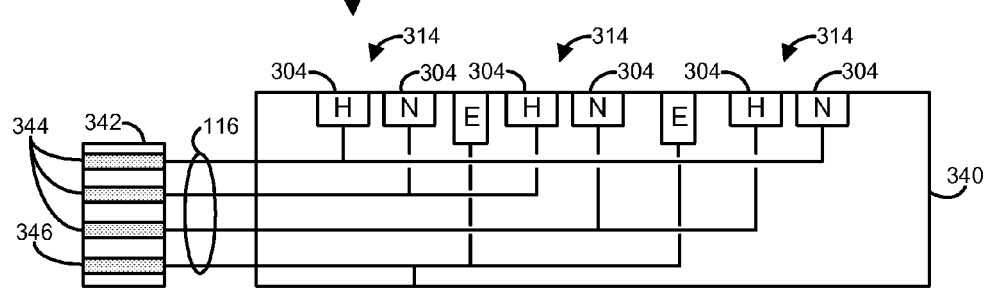

FIGS. 3A through 3C are wiring diagrams of example adapters showing how the scalable PDU 100 may be adapted for using various types of electrical power according to the teachings of the present disclosure. Each adapter is configured to adapt a power source having a certain output configuration (e.g., single phase configuration, three phase wye configuration, or three phase delta configuration) to the power distribution modules 122. Although three adapters are shown and described herein, it should be understood that other adapters configured for use with other types of power sources may be used. For example, an adapter wired to accept only two phases of a three phase power source may be implemented with the teachings of the present disclosure.

FIG. 3A illustrates an example adapter 124" that may be used to adapt a source of power having three, single phase legs for use by the power distribution modules 122. The adapter 124" includes an adapter chassis 302 that houses multiple connector elements 304, which in this particular case are receptacles. The connector elements 304 are coupled to a connector 306 through a cable 116. Although any suitable type of connector may be implemented, the connector 306 as shown is a model number CS8365 as specified by the International Electotechnical Commission (IEC). The connector 306 and cable 116 provide at least one hot leg 308, one neutral leg 310, and one earth (i.e., ground) leg 312. The adapter 124" provides three independent power legs 314 to supply electrical power to the power distribution modules 122 using a hot leg 'H' and a neutral leg 'N' for each independent leg 314. As shown, the hot leg 308 of the connector 306 is connected to the hot legs of the adapter 124", while the neutral leg 310 of the connector 306 is connected to the neutral legs 3 of the adapter 124". Additionally, the earth leg 312 of the connector 306 is connected to the adapter housing 302 and earth legs 'E'.

FIG. 3B illustrates an example adapter 124''' that may be used to adapt a three phase wye power source for use by the power distribution modules 122. The adapter 124''' includes an adapter chassis 320 physically coupled to a connector 322 using a cable 116. The connector 322 as shown is a model number 'IEC60309-3P+N+E' as specified by the IEC although any type may be used. The connector 322 and cable 116 are configured to provide three legs 324 of a three phase wye power source and one common neutral connection 326. Like the adapter shown above with respect to FIG. 3A, the adapter 124''' provides three independent power legs 314 including connector elements 304 to supply electrical power to the power distribution modules 122 using a hot leg 'H' and a neutral leg 'N' for each independent power leg 314. As shown, each hot leg is connected to corresponding legs 324 of the connector 322, while the neutral legs of each power leg 314 is connected to the neutral leg 326 of the connector 322. Additionally, an earth leg 327 is provided that is electrically coupled to earth legs 'E' of the connector elements 304.

FIG. 3C illustrates an example adapter 124'''' that may be used to adapt a three phase delta power source for use by the power distribution modules 122. The adapter 124'''' includes an adapter chassis 340 physically coupled to a connector 342 using a cable 116. The connector 342 as shown is a model number 'IEC60309-4P+E' as specified by the IEC although any type may be used. The connector 342 and cable 116 configured to provide three legs 344 of a three phase delta power source and one common earth connection 346. Like the adapter shown above with respect to FIG. 3A, the adapter 124'''' provides three independent power legs 348 to supply electrical power to the power distribution modules 122 using a hot leg 'H' and a neutral leg 'N' for each independent leg 348. The adapter 124'''', however, is different from the adapter 124" of FIG. 3A in that each leg 348 is connected to hot legs 344 as shown to adapt the incoming three phase delta power source 118 for use with three independent power legs 348 for use by the power distribution modules. Additionally, the earth leg 346 is electrically coupled to earth legs 'E' of the connector elements 304 and the chassis of the adapter 124'''.

The adapters 124", 124''', or 124'''' may be alternatively interconnected to the power distribution modules 122 according to the type of an available source of power at any time during manufacture and/or during the serviceable life of the computing system housed in the computing rack 102. For example, a computing system may be constructed using standardized power cabling for the computing equipment devices 114 configured in the power computing rack 102. When the computing system is to be placed in service, an available power source 118 may then be identified (e.g., single phase configuration, three phase delta configuration, three phase wye configuration), and an appropriate adapter 124", 124''', or 124'''' may be implemented based to the identified source of electrical power. Although these three adapters are shown and described herein, it should be understood that other adapters configured for use with other types of electrical power may be used. For example, either of the adapters 124", 124''', or 124'''' described above may be implemented with respective connectors 306, 322, or 342 respectively, or alternatively, either adapter 124", 124''', or 124'''' may be implemented with a bare cable (i.e., no connector) to facilitate coupling to a power source configured with wire taps.

Figure 4A:
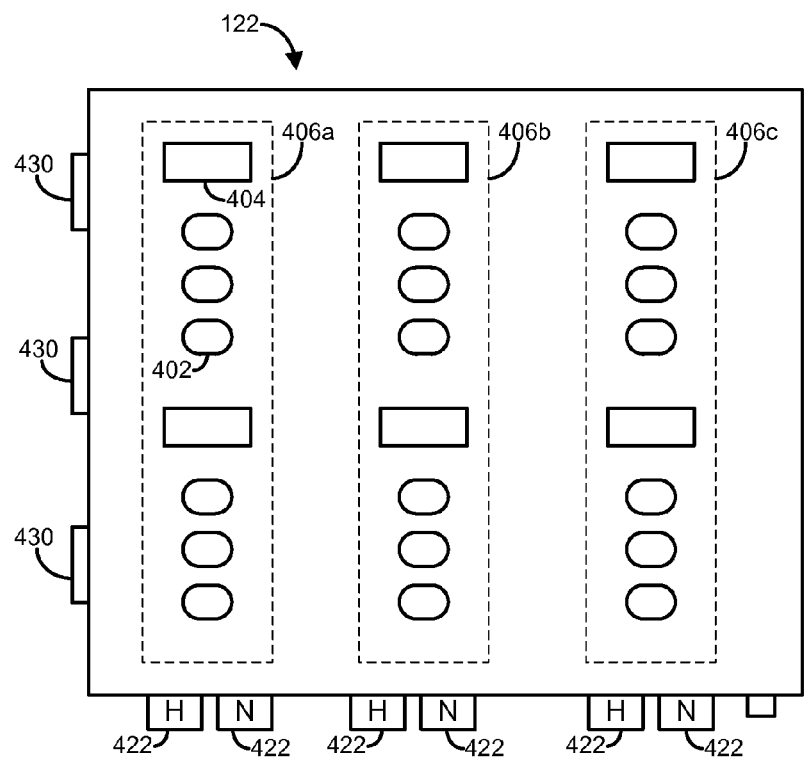
FIGS. 4A and 4B illustrate an example power distribution module according to one embodiment.
Figure 4B:
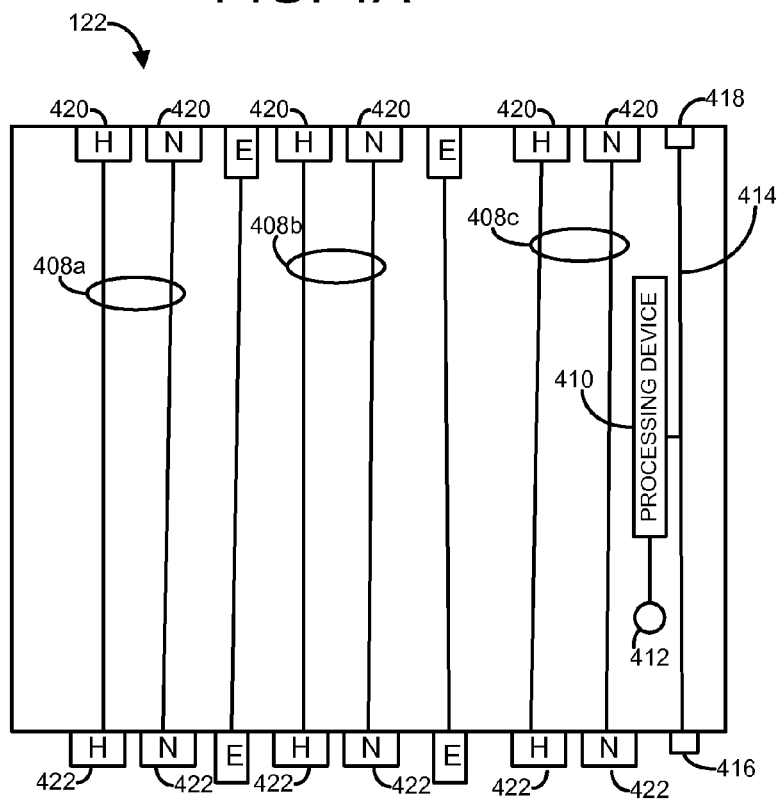

FIGS. 4A and 4B illustrate an example power distribution module 122 according to the teachings of the present disclosure. Specifically, FIG. 4A illustrates example receptacles, circuit breakers, and/or other features that may be provided by each power distribution module 122, while FIG. 4B illustrates the power distribution module 122 with these features removed in order to reveal power buses extending through the power distribution module 122.

As shown in FIG. 4A, the power distribution module 122 includes several receptacles, which in this particular embodiment includes multiple C13 type receptacles 402, and multiple C19 type receptacles 404. The receptacles 402, 404 are arranged in columns 406a, 406b, and 406c such that the receptacles 402, 404 of column 406a are coupled to power bus 408a, the receptacles 402, 404 of column 406b are coupled to power bus 408b, and the receptacles 402, 404 of column 406c are coupled to power bus 408c. Given this configuration of receptacles 402, 404, computing equipment devices 114 may be coupled to the PDU 100 in a manner for proper load sharing among the legs formed by the power buses 408a, 408b, and 408c. For example, a user may calculate total power requirements for all computing equipment devices 114 in the system, and the devices 114 coupled to a combination of receptacles 402, 404 that optimally loads each power bus 408a, 408b, and 408c.

As shown in FIG. 4b, each power bus 408a, 408b, and 408c includes a hot leg 'H' and a neutral leg 'N' that extend from the bottom surface of the power distribution module 122 to the top surface of the power distribution module 122. Additionally, two earth legs 'E' are included that extend from the bottom surface of the power distribution module 122 to the top surface of the power distribution module 122.

Each power bus includes connector elements, which in this particular embodiment are receptacles 420 on the top surface of the power distribution module 122 and male pins 422 extending from the bottom surface of the power distribution module 122. The receptacles 420 are a female complement to the male pins 422 such that the receptacles 420 may be mated with the male pins 422 of another power distribution module 122. The hot leg 'H' and neutral leg 'N' of each power bus extending from the receptacles 420 to the male pins 422 may be formed of any suitable conductive material, such as an elongated strip of copper material, or the like. In one embodiment, the male pins forming the earth legs 'E' are longer than the male pins forming the hot legs 'H' and the neutral legs 'N'. In this manner, safety for the PDU 100 may be enhanced in that the earth legs will always make contact first and thus protect from any ground fault that may occur when the power distribution unit is coupled to another power distribution unit or the adapter 124.

As can be seen, arrangement of the receptacles and pins provide a configuration in which multiple power distribution modules 400 may be stacked one upon another. In one embodiment, each receptacle includes an elastic guard cover to reduce or inhibit insertion by other objects, such as fingers of a user, a screwdriver, or other device that may cause electrical shock or damage to the power distribution module 122. According to one aspect, the power distribution module 122 is configured with circuit breakers 430 for each power bus.

Each power distribution module 122 may include a processing device 410 that may be configured to monitor and/or control various features of the power distribution module 122 in which it is configured. For example, the processing device 410 may receive telemetry data from one or more sensors 412, such as temperature and/or voltage sensors configured in the power distribution module 122 and transmit the information to a monitoring application executed on another computing equipment device 114 configured in the computing system. In one aspect, the processing device 410 communicates with the other computing equipment device 114 or a processing device 410 configured in another power distribution module 122 using a communication cable 414 having a male plug 416 at the bottom end of the power distribution module 122 and a receptacle 418 at the top surface of the power distribution module 122. In this manner, as multiple power distribution modules 400 are stacked upon each other the communication cables 414 of each power distribution module 122 forms a daisy chain-like connection to the computing equipment device 114 that monitors conditions of each power distribution module 122.

Figure 5:
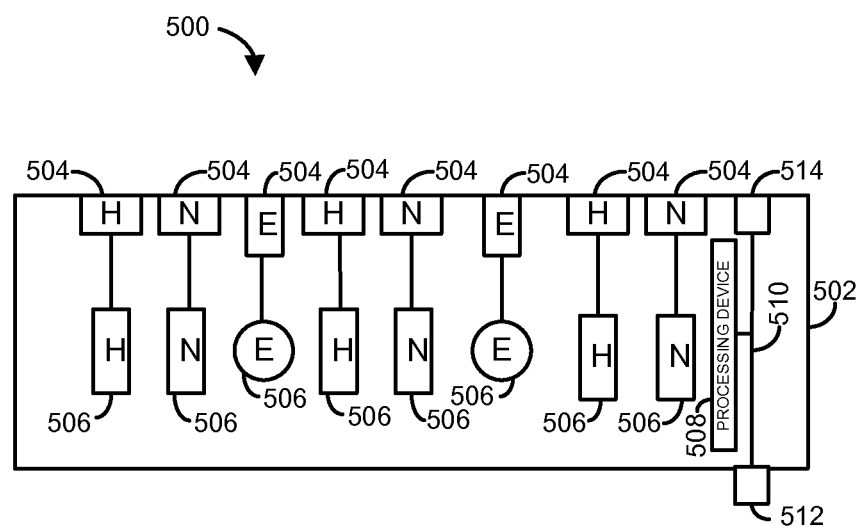
FIG. 5 illustrates an example adapter interconnector according to one embodiment.

FIG. 5 illustrates an example adapter interconnector 128 according to the teachings of the present disclosure. The adapter interconnector 128 electrically couples the adapter 124 to the power distribution units 122, and have a processing device 506 for monitoring and/or controlling various features of the PDU 100.

The adapter interconnector 128 includes a chassis 502 that houses multiple receptacles 504 and multiple male pins 506. The receptacles 504 are each electrically coupled to corresponding male pins 506. The receptacles/male pins include three hot legs 'H' and three neutral legs 'N' for coupling the adapter 124 to the power distribution units 122. Additionally, two receptacles and two male pins are provided for electrical coupling of an earth leg 'E' from the adapter 124 to the power distribution units 122. The adapter interconnector 128 includes a processing device 508 that may be configured to monitor and/or control various features of its associated adapter. In one aspect, the processing device 508 communicates with one or more of the computing equipment devices 114 using a communication cable 510 having a male plug 512 configured on the chassis and a receptacle 514 at the top surface of the adapter.

Figure 6:
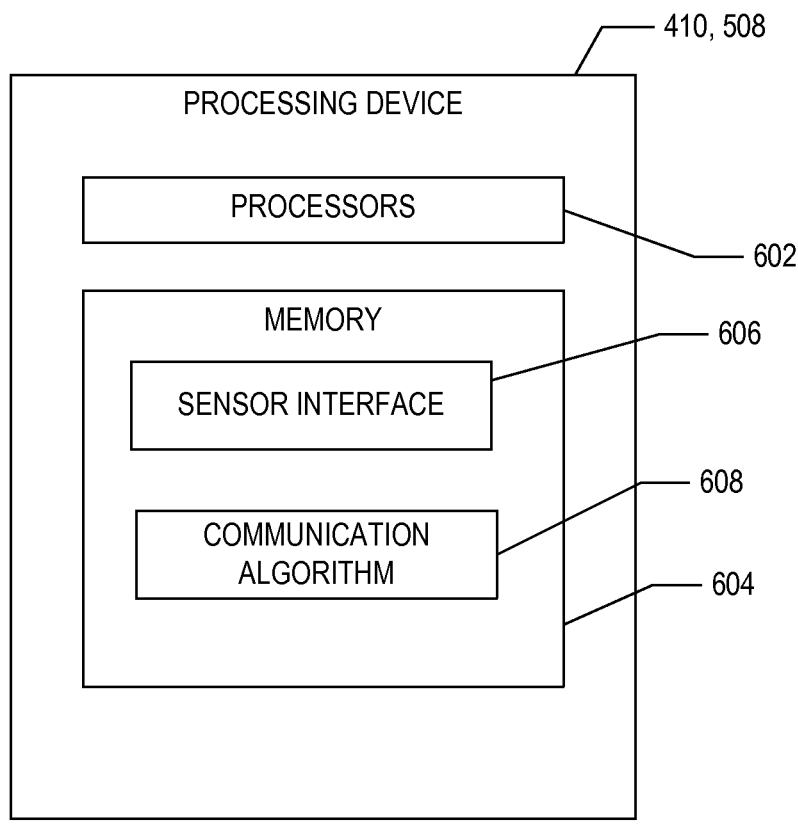
FIG. 6 illustrates an example processing device that may be implemented with the scalable PDU according to one embodiment.

FIG. 6 illustrates an example processing device 410, 508 according to one aspect of the present disclosure. The processing device 410, 508 is a computing or processing device that includes one or more processors 602 and memory 604 and is to receive data and/or communications from, and/or transmit data and/or communications to, a computer equipment device 114 via the communication cable 414. The memory 604 stores a sensor interface 606 and a communication algorithm 608 that are executed by the processors 602. The sensor interface receives measurement information from one or more sensors 412 configured in its respective power distribution module 122, processes the information, and then transfers the processed information to the communication algorithm 608 that transmits the information to the remote computer equipment device 114 using the communication cable 414. For example, the sensor interface 606 may receive current information indicating an overload condition on one leg of the power distribution module 122, and transfer this information to the communication algorithm 608 to notify the remote computer equipment device 144 that a fault condition exists in the power distribution module 122.

Figure 7:
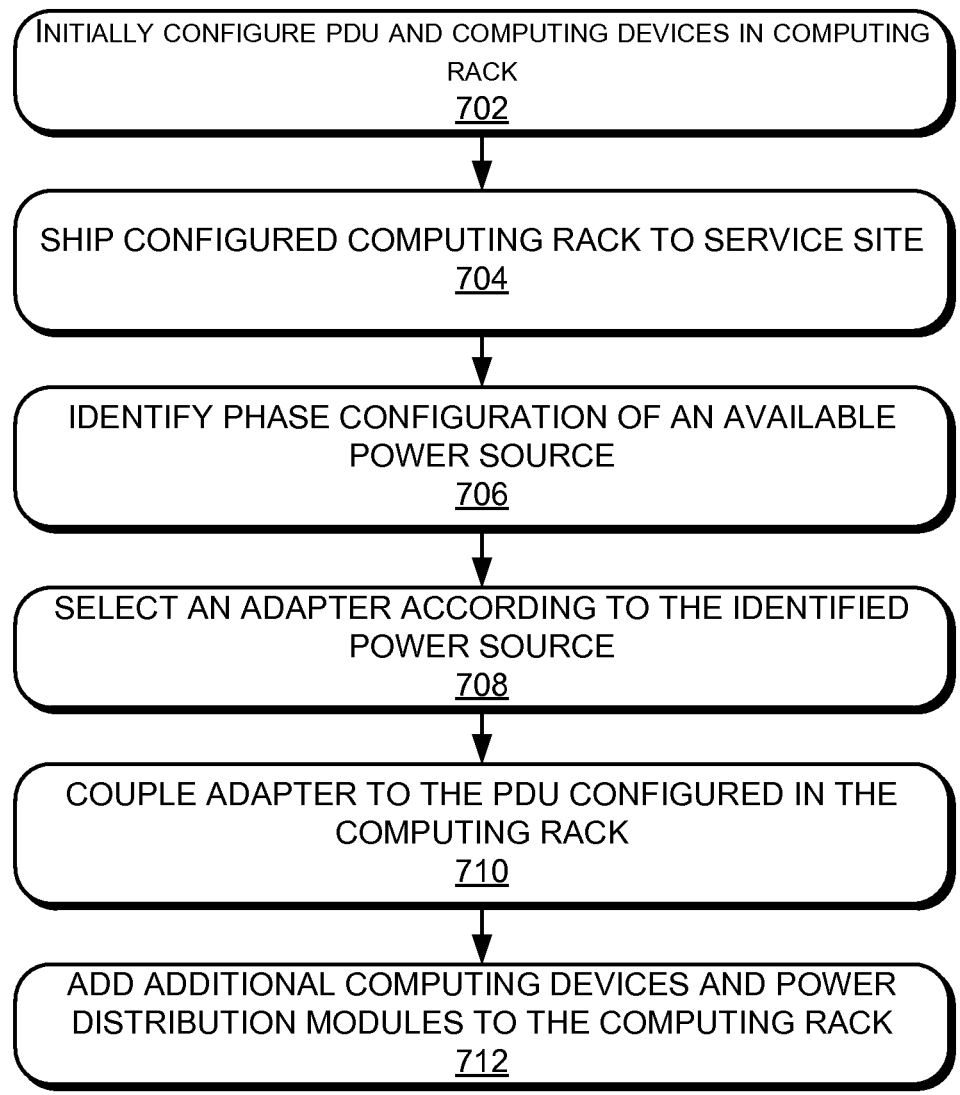
FIG. 7 illustrates an example process that may be performed to provide electrical power to the computer equipment devices configured in a computing rack according to one embodiment.

FIG. 7 illustrates an example process that may be performed to provide electrical power to the computer equipment devices 114 configured in a computing rack 102 according to the teachings of the present disclosure.

In step 702, a computer system is initially configured by installing a power distribution module 122 in a computing rack 102 and the computing rack populated with multiple computer equipment devices 114. The computer equipment devices 114 may be any device that is used in support of the overall computer system. For example, the computer equipment devices may include computing processing devices, such as personal computers, rack-mounted computers, communication devices, such as routers, switches, and/or hubs, and ancillary equipment, such as fans, heaters, or other environmental control systems. The initially configured computing system is then shipped to a service site where it will be placed in service in step 704.

In step 706, a suitable power source may then be identified at the service site. For example, it is known that certain locations around the world have power configurations that have been standardized for their particular region, such as the United States which normally provides power sources have a delta phase configuration, or Europe which normally provides power sources having a three phase wye configuration. Thus, an appropriate adapter 124 may be selected for adapting the available power source to a form suitable for use by the power distribution modules 122 in step 708.

In one aspect, multiple adapters 124 of differing types may be selected for powering the computer equipment devices from differing power sources. For an example in which at least two scalable PDUs 100 are provided in the computing rack 102, one scalable PDU 100 may be configured to be powered from a nearby utility company that provides a three phase delta configuration, while the other scalable PDU 100 is to be powered from an emergency power source, such as a gas-powered generator that provides single phase electrical power. Thus, the first scalable PDU 100 may be configured with a three phase delta configuration adapter as shown in FIG. 3C, while the second scalable PDU 100 is configured with a single phase configuration adapter as shown in FIG. 3A.

In step 710, the selected adapter 124 is then coupled to the power distribution module 122 such that power may be applied to the computer equipment devices 114 of the computing system.

In step 712, one or more additional power distribution modules 122 and additional computer equipment devices 114 are added to the computing rack 102. According to one aspect, the additional power distribution modules 122 may be added without modification (i.e., removal and/or replacement) of existing power distribution modules 122. In this manner, the capabilities of the computing system may be enhanced without incurring costs via system downtime or significant maintenance caused by modifying the existing PDU structure.

Step 712 may be performed additional times to add additional computing resources to the computing system using additional computer equipment devices 114 along with additional power distribution modules 122 to power these devices. Nevertheless, when use of the computing system is no longer needed or desired, the process ends.

Although FIG. 7 describes one example of a process that may be performed for configuring a computing system with power provided by the scalable PDU 100, it should be understood that other processes may be performed without departing from the spirit or scope of the present disclosure. For example, the computing rack 102 may be fully populated with power distribution modules 122 or partially populated with a subset of power distribution modules 122 prior to being shipped to its service site. Additionally, the adapter 124 may be initially configured on the power distribution modules 122 prior to being shipped to the service site.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A power distribution unit (PDU) comprising:
   at least two power distribution circuits for distributing electrical power to a plurality of devices deployed in a computing rack, each power distribution circuit comprising a plurality of power receptacles for coupling to the plurality of devices disposed in the computing rack; and
   an interchangeable adapter coupled to the power distribution circuits to provide the electrical power to the power distribution circuits, the interchangeable adapter electrically connectable to one of a plurality of different electrical power sources in which each electrical power source has a phase type configuration including at least one of a three phase delta connection, the interchangeable adapter comprising a first connector that is removably connectable to a second connector of a first of the power distribution circuits, the interchangeable adapter providing the power to the first power distribution circuit through the first connector,
   wherein each power distribution circuit comprises a housing with the second connector configured on a first side of the housing and a third connector configured on a second side of the housing in which the second side is opposite the first side of the housing so that the at least two power distribution circuits may be stacked upon each other, and
   wherein when the first connector of the interchangeable adapter is connected to the second connector of a first power distribution circuit and the second connector of a second power distribution circuit is connected to the third connector of the first power distribution circuit, power from the interchangeable adapter may be provided to the second power distribution circuit through the first power distribution circuit.

2. The PDU of claim 1, wherein the first connector comprises a plurality of first connector elements configured on at least one of its surfaces, the first connector elements configured to be electrically coupled to complementary second connector elements configured on an adapter interconnector, the adapter interconnector comprising a plurality of third connector elements that are configured to be electrically coupled to complementary fourth connector elements of the second connector configured on at least one surface of the second power distribution circuit.

3. The PDU of claim 2, wherein the first connector elements of the first connector comprise a plurality of male pins and the complementary second connector elements of the adapter interconnector comprise a plurality of female receptacles.

4. The PDU of claim 1, wherein the phase type configuration of another power source comprises at least one of a single phase configuration, and a three phase wye configuration.

5. The PDU of claim 1, wherein the interchangeable adapter comprises a latch mechanism for releasably securing the interchangeable adapter to the first power distribution circuit.

6. The PDU of claim 1, wherein the at least two power distribution circuits comprises three power distribution circuits.

7. The PDU of claim 1, wherein at least one of the power distribution circuits comprises a processing device to monitor one or more sensors and transmit telemetry data associated with the monitored sensors.

8. The PDU of claim 1, wherein the power distribution circuits and the interchangeable adapter are configured on a side of the computing rack.

9. The PDU of claim 1, wherein the interchangeable adapter comprises a connector configured on a housing of the interchangeable adapter.

10. The PDU of claim 1, wherein the interchangeable adapter comprises a connector coupled to the interchangeable adapter through a cable.

11. The PDU of claim 1, further comprising an adapter interconnector coupled between the interchangeable adapter and the power distribution unit, the adapter interconnector comprising a processing device to monitor one or more sensors and transmit telemetry data associated with the monitored sensors.

12. A computing rack comprising:
an enclosure for housing a plurality of devices; and
a power distribution unit (PDU) comprising:
at least two power distribution circuits configured in the enclosure, each power distribution circuit comprising a plurality of power receptacles for distributing electrical power to the plurality of devices housed in the enclosure; and
an interchangeable adapter coupled to the power distribution circuits to provide power to the power distribution circuits, the interchangeable adapter electrically connectable to one of a plurality of different electrical power sources in which each electrical power source has a phase type configuration including at least one of a three phase delta connection, the interchangeable adapter comprising a first connector that is removably connectable to a second connector a first of the power distribution circuits, the interchangeable adapter providing the power to the power distribution circuit through the first connector,
wherein each power distribution circuit comprises a housing with the second connector configured on a first side of the housing and a third connector configured on a second side of the housing in which the second side is opposite the first side of the housing so that the at least two power distribution circuits may be stacked upon each other, and
wherein when the first connector of the interchangeable adapter is connected to the second connector of a first power distribution circuit and the second connector of a second power distribution circuit is connected to the third connector of the first power distribution circuit, power from the interchangeable adapter may be provided to the second power distribution circuit through the first power distribution circuit.

13. The computing rack of claim 12, wherein the PDU comprises two PDUs each configured on opposing sidewalls of the enclosure.

14. The computing rack of claim 12, wherein at least one of the power distribution circuits comprises a circuit breaker for each of multiple phases of the electrical power source.

15. The computing rack of claim 12, wherein the first connector comprises a plurality of first receptacles configured on its surface, the first receptacles configured to be electrically coupled to complementary first male pins configured on an adapter interconnector, the adapter interconnector comprising a plurality of second receptacles on its upper surface, the second receptacles configured to be electrically coupled to complementary second male pins on the second connector.

16. The computing rack of claim 15, wherein at least one of the power distribution circuits further comprising a plurality of third receptacles configured on a top surface of the one power distribution circuit, the third receptacles electrically coupled to the second connector of another power distribution circuit.

17. The computing rack of claim 12, wherein the interchangeable adapter comprises a power source connector coupled to the interchangeable adapter using an electrical cable.

18. The computing rack of claim 12, wherein the interchangeable adapter comprises a power source connector configured on a housing of the interchangeable adapter.

19. The computing rack of claim 12, wherein the phase configuration of another electrical power source comprises at least one of a single phase configuration, and a three phase wye configuration.

* * * * *